(12) United States Patent
DeBoer et al.

(10) Patent No.: US 7,038,265 B2
(45) Date of Patent: May 2, 2006

(54) CAPACITOR HAVING TANTALUM OXYNITRIDE FILM AND METHOD FOR MAKING SAME

(75) Inventors: Scott Jeffrey DeBoer, Boise, ID (US);
Husam N. Al-Shareef, Boise, ID (US);
Randhir P. S. Thakur, Cupertino, CA (US); Dan Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/073,800

(22) Filed: Mar. 7, 2005

(65) Prior Publication Data
US 2005/0161710 A1 Jul. 28, 2005

Related U.S. Application Data

(62) Division of application No. 10/232,206, filed on Aug. 29, 2002, now Pat. No. 6,864,527, which is a division of application No. 09/031,526, filed on Feb. 26, 1998, now Pat. No. 6,458,645.

(51) Int. Cl.
*H01L 27/108* (2006.01)

(52) U.S. Cl. .................. 257/303; 257/306; 257/308; 257/309; 257/310

(58) Field of Classification Search ............ 257/303, 257/306, 308, 309, 310, 532; 361/305, 306.3, 361/322, 321.1
See application file for complete search history.

(56) References Cited

U.S. PATENT DOCUMENTS

| | | | |
|---|---|---|---|
| 4,084,986 A | 4/1978 | Aoki et al. | |
| 5,110,754 A | 5/1992 | Lowrey et al. | |
| 5,111,355 A | 5/1992 | Anand et al. | |
| 5,142,438 A | 8/1992 | Reinberg et al. | |
| 5,248,629 A | 9/1993 | Muroyama | |
| 5,352,623 A | 10/1994 | Kamiyama | |
| 5,362,632 A | 11/1994 | Mathews | |
| 5,585,301 A | 12/1996 | Lee et al. | |
| 5,677,015 A | 10/1997 | Hasegawa | |
| 6,150,208 A | 11/2000 | Deboer et al. | |

OTHER PUBLICATIONS

Fazan, P. C., et al., "A High-C Capacitor (20.4 fF/um2) with Ultrathin CVD—Ta2O5 Films Deposited on Rugged Poly-Si for High Density DRAMs", *Int'l Electron Devices Meeting: Technical Digest*, San Francisco, CA,(Dec. 1992),263-266.

Fazan, P. C., et al., "Ultrathin Ta2O5 Films on Rapid Thermal Nitrided Rugged Polysilicon for High Density DRAMs", *Extended Abstracts: Int'l Conference on Solid State Devices and Materials*, Tsukuba,(Aug. 1992),697-698.

(Continued)

*Primary Examiner*—Minhloan Tran
*Assistant Examiner*—Tan Tran
(74) *Attorney, Agent, or Firm*—Schwegman, Lundberg, Woessner & Kluth, P.A.

(57) ABSTRACT

A capacitor has a tantalum oxynitride film. One method for making the film comprises forming a bottom plate electrode and then forming a tantalum oxide film on the bottom plate electrode. Nitrogen is introduced to form a tantalum oxynitride film. A top plate electrode is formed on the tantalum oxynitride film.

55 Claims, 8 Drawing Sheets

OTHER PUBLICATIONS

Wolf, S., et al., *In: Silicon Processing for the VLSI Era,* vol. 1, Lattice Press, Sunset Beach, CA,(1986),p. 56-57, 194.

CAPACITOR HAVING TANTALUM OXYNITRIDE FILM AND METHOD FOR MAKING SAME

This application is a Divisional of U.S. application Ser. No. 10/232,206, filed Aug. 29, 2002, now U.S. Pat. No. 6,864,527, which is a Divisional of U.S. application Ser. No. 09/031,526, filed Feb. 26, 1998, now U.S. Pat. No. 6,458,645, each of which is incorporated herein by reference.

FIELD OF THE INVENTION

The present invention relates to semiconductor structures and methods for fabricating such structures in semiconductor integrated circuits and, in particular, to forming capacitors for memory cells having high dielectric constant materials therein.

BACKGROUND OF THE INVENTION

Dynamic random access memories (DRAMs) are the most widely used form of memory integrated circuits to date. DRAMs are composed of memory cell arrays and peripheral circuitry required for cell access and external input and output. Each memory cell array is formed of a plurality of memory cells for storing bits of data. Typical memory cells are formed of a capacitor, for storing electric charges and a transistor, for controlling charge and discharge of the capacitor. Of primary concern is maximizing the storage capacitance of each memory cell capacitor, particularly in light of the demand for 256 Mb DRAMs today and higher densities in the future without increasing the chip space required to form the array. There is a need to decrease the chip space required to form each memory cell while maximizing the capacitance of the memory cells. The importance of high density DRAMs cannot be overstated in today's competitive microelectronics market. Devices are becoming smaller, but they are required to provide much more performance.

One way to achieve greater capacitance per unit area is to roughen the surface of the capacitor plate, increasing the surface area. As can be seen from the following equation (I), the most important parameters involved in achieving maximum charge, Q, stored on the capacitor are the thickness of the capacitive dielectric film ($t_{cdf}$), the area of the capacitor (A), and the dielectric constant ($\in$). The voltage applied across the capacitor plates is V.

$$Q = (\in \cdot A \cdot V)/t_{cdf} \quad (I)$$

Increasing the capacitor area (A) by forming the storage capacitor in a trench shape etched in the substrate is well known in the art, as well as using a stacked capacitor structure. Stacked-type capacitors feature a major part of the capacitor extending over the gate electrode and field isolating film of the underlying transistor. Such structures are generally composed of a lower plate electrode (consisting of a base portion and a standing wall portion), a capacitive dielectric film, and an upper plate electrode. Other complex topographical lower plate electrode configurations have also been used to maximize the capacitive area (A) of a memory cell, such as fin-type, double-sided, and roughened lower plate electrode structures produced using hemispherical grain (HSG) polysilicon.

In addition to increasing the capacitive surface area (A) of a memory cell, as can be seen from the above equation (I), the thickness of the capacitive dielectric film ($t_{cdf}$) must be minimized to maintain the maximum charge stored on the capacitor. However, the capacitive dielectric film must also prevent direct electrical contact between the lower and upper electrodes to prevent the charge from decaying.

It is also desirable to utilize a capacitive dielectric film having as high of a dielectric constant ($\in$) as possible to further increase the capacitance per unit area of a memory cell. One material that has a high dielectric constant is tantalum oxide, such as tantalum penta oxide ($Ta_2O_5$). $Ta_2O_5$ potentially has a dielectric constant ($\in$) of about 22, which is significantly greater than conventional silicon oxide, which has a dielectric constant ($\in$) of only about 3.9.

A capacitor of a memory cell formed with $Ta_2O_5$ insulator includes an electrode. To attain adequate step coverage for the electrode on an integrated circuit, the electrode may be initially formed with an organometallic precursor that contains carbon.

After the capacitor is formed, the integrated circuit is subject to a high temperature processing step, such as borophosphosilicate glass (BPSG) reflow or polysilicon activation. During such heating, in the memory cell capacitor, carbon from the electrode diffuses into the $Ta_2O_5$ insulator. The carbon in the $Ta_2O_5$ insulator forms a leakage mechanism that renders the capacitor unusable. A relatively high leakage current flows through the capacitor even when relatively small voltage is applied across the capacitor. Therefore, there is a need for a capacitor that has a relatively high capacitance per unit area, to ensure high device density, and a relatively low leakage current. There is also a need for a dielectric material having a high dielectric constant that is substantially unaffected by subsequent high temperature processing steps.

SUMMARY OF THE INVENTION

A capacitor has a tantalum oxynitride film. One method for making the film comprises forming a bottom plate electrode and then forming a tantalum oxide film on the bottom plate electrode. Nitrogen is introduced to form a tantalum oxynitride film. After formation of the tantalum oxide film, the capacitor is annealed in an environment containing oxygen. This anneal crystallizes and fills vacancies in the tantalum oxide film. This oxygen anneal may be performed after the introduction of nitrogen, such as by anneal, if the nitrogen introduction is performed at a temperature of greater than approximately 600 degrees Celsius. In one embodiment, the oxygen anneal is performed after the nitrogen anneal, when the nitrogen introduction is performed at a temperature between approximately 500 and 750 degrees Celsius. In another embodiment, the oxygen anneal is performed after the nitrogen anneal when the nitrogen introduction is performed at a temperature between approximately 750 and 1050 degrees Celsius. A top plate electrode is formed on the tantalum oxynitride film. In another embodiment, an anti-fuse is formed in the same manner.

In one embodiment, the step of forming the tantalum oxide film comprises the steps of forming tantalum on the bottom electrode, and oxidizing the tantalum. In another embodiment, tantalum oxide film is formed by chemical vapor deposition with tantalum and oxygen sources. In yet another embodiment, the tantalum oxide film is annealed to form a tantalum oxynitride film $Ta_xN_yO_z$, wherein $(y+z)/x > 2.5$.

In another embodiment, the method of forming the capacitor includes the step of forming a bottom plate electrode. A tantalum oxynitride film is formed on the bottom plate electrode. A top plate electrode is formed on the tantalum oxynitride film. In one embodiment, the tantalum oxynitride film is formed by metal organo chemical vapor deposition with a nitrogen source that is hydrazene at a temperature between approximately 400 and 600 degrees Celsius so as to form amorphous tantalum oxynitride.

In another embodiment, the invention is a capacitor that has a bottom plate electrode, a tantalum oxynitride film and a top plate electrode. In an embodiment, the tantalum oxynitride film is formed with an oxygen anneal performed after nitrogen is introduced into a tantalum oxide film. In one embodiment, the tantalum oxynitride film is amorphous.

In one embodiment, the capacitor may be used in a memory array of a memory. The memory comprises the memory array, a control circuit, operatively coupled to the memory array, and address logic, operatively coupled to the memory array and the control logic.

In yet another embodiment, the capacitor may be used in the memory array of a system. The system comprises a memory and a processor coupled to the memory.

In yet a further embodiment, an antifuse is operated by applying a voltage across the electrodes of the capacitor having a tantalum oxynitride film. A hole is formed in the tantalum oxynitride film.

It is an advantage of the present invention that the capacitor has a high dielectric constant. It is also a benefit of the present invention that it is less affected by heat so as to have reduced leakage current. It is a further advantage of the invention that the capacitor has enhanced reliability.

DESCRIPTION OF THE EMBODIMENTS

Figure 1A:
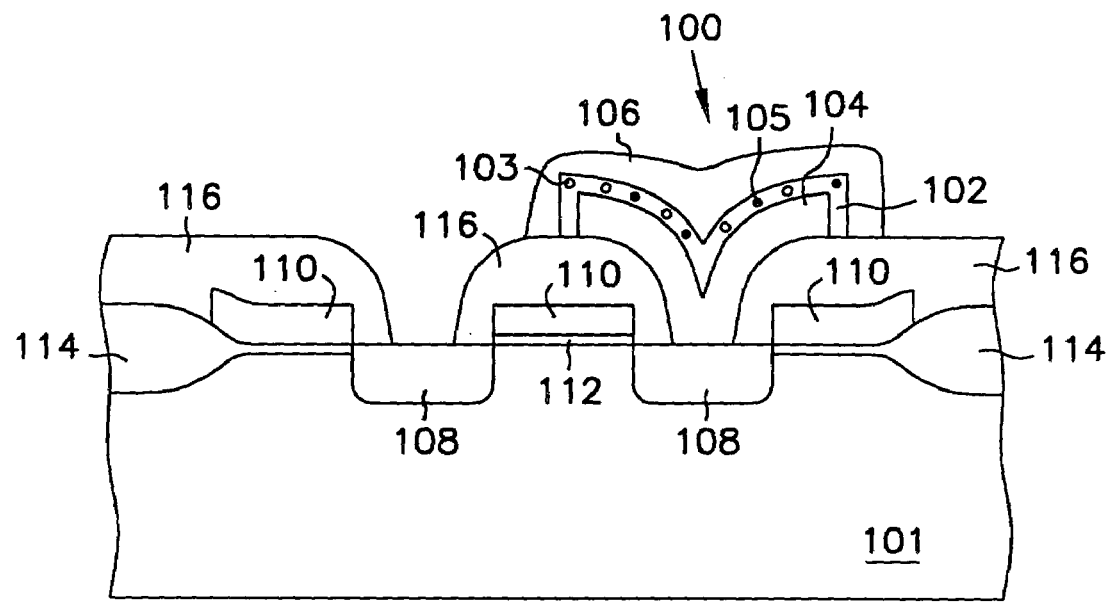
FIG. 1A is a cross-sectional representation of a polysilicon electrode stacked, double-sided capacitor memory cell formed according to the method of the invention, wherein the capacitor is stacked on a source/drain region of an underlying access transistor.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

Figure 1B:
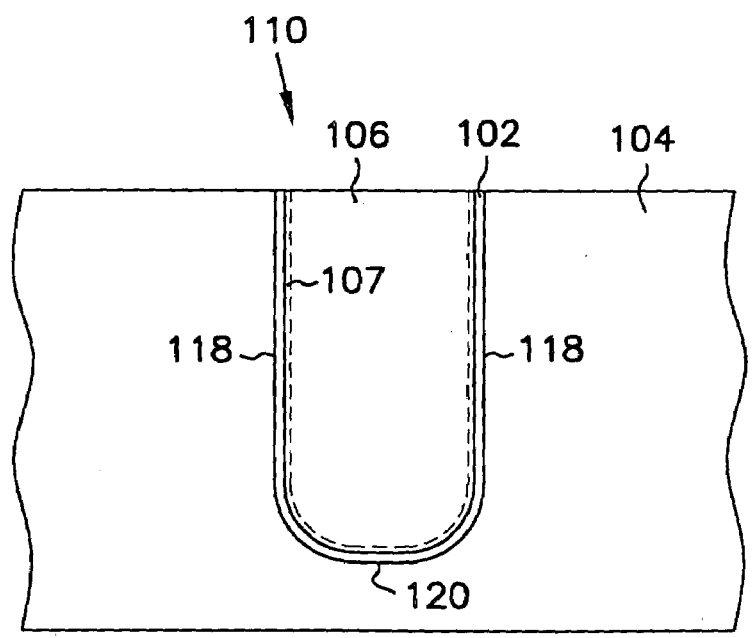
FIG. 1B is a cross-sectional representation of a trench-type capacitor memory cell formed according to the method of the invention.

FIGS. 1A and 1B represent, generally, capacitors 100 of memory cells formed in accordance with the method of the invention. The following description details process steps utilized to form the capacitors 100. In particular, the process steps described are directed towards forming a tantalum oxynitride film 102 between bottom and top plate electrodes 104, 106, respectively, of a capacitor 100.

FIG. 1A is a cross-sectional representation of a stacked, double-sided capacitor 100 formed according to the method of the invention, wherein the capacitor 100 is stacked on a source/drain region 108 of an underlying access transistor. The access transistor comprises source/drain regions 108 on both sides of a gate structure, which includes a polysilicon gate 110 and gate oxide 112. The access transistor is fabricated in an active area of an underlying substrate 101 that is defined by field oxide 114. Typically, the gate oxide 112 and the field oxide 114 are formed using a conventional method, such as LOCal Oxidation of Silicon (LOCOS). The capacitor 100 is supported over the source/drain region 108 by an insulating material 116, such as borophosphosilicate glass (BPSG), which reflows easily to produce rounded corners over the gate 110, allowing better step coverage.

Figure 1C:
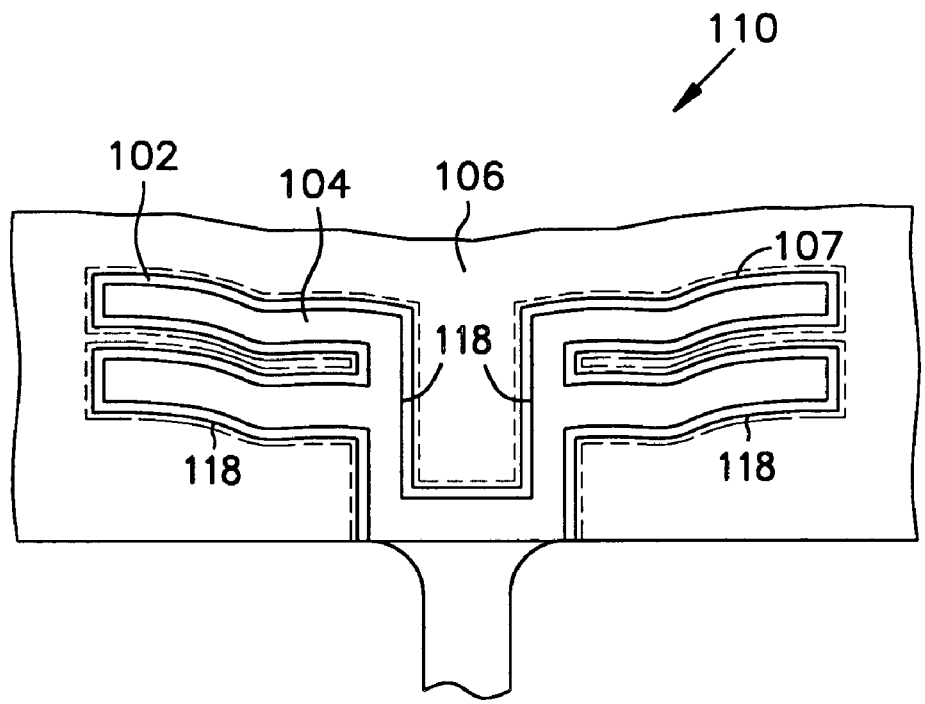
FIG. 1C is a cross-sectional representation of a fin-type capacitor memory cell formed according to the method of the invention.
Figure 1D:
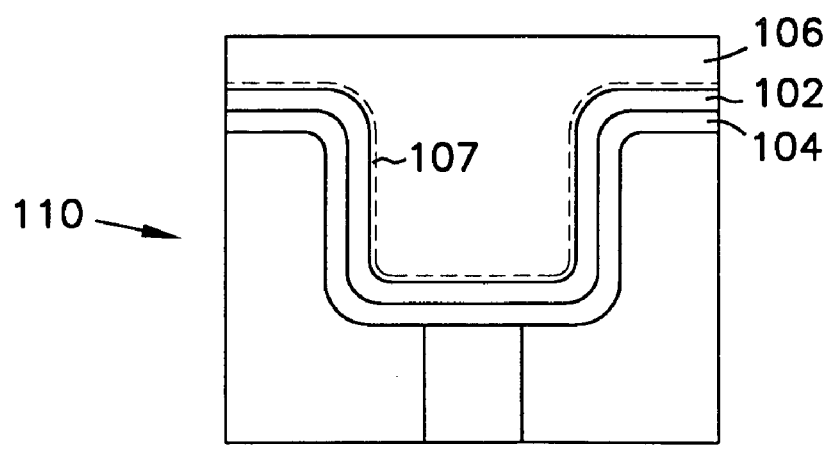
FIG. 1D is a cross-sectional representation of a container-type capacitor memory cell formed according to the method of the invention.
Figure 1E:
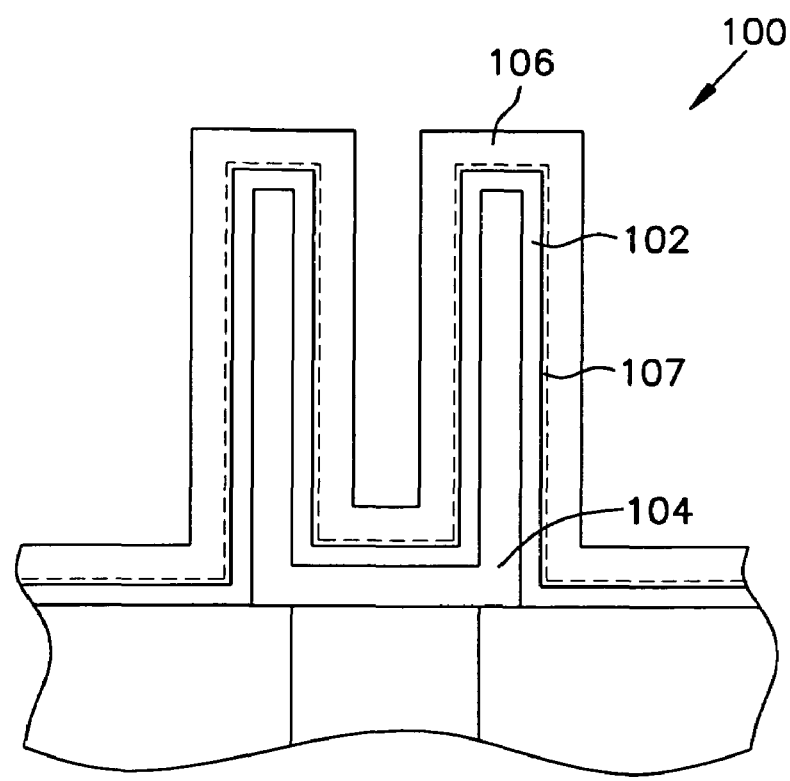
FIG. 1E is a cross-sectional representation of a crown-type capacitor memory cell formed according to the method of the invention.

FIG. 1B is a cross-sectional representation of a trench-type capacitor 100 formed according to the method of the invention, wherein the trench shape is defined by sidewalls 118 and a bottom surface 120. FIGS. 1A and 1B are meant to be illustrative, generally, of various capacitor 100 shapes and electrode 104, 106 topographies that increase the surface area of the capacitor 100. The capacitor 100 shape and topography of the electrodes 104 and 106 in a capacitor 100 are not critical to practicing the invention. The capacitor 100 may also be formed as a fin-type as shown in FIG. 1C, container-type as shown in FIG. 1D, or crown-type capacitor as shown in FIG. 1E. The scope of the invention is not meant to be limited to those capacitors 100 illustrated.

Figure 1F:
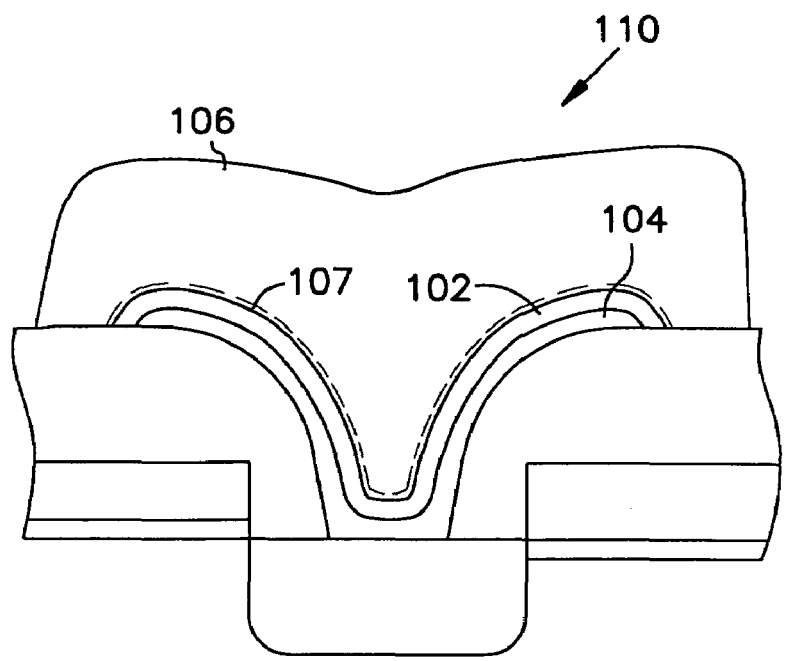
FIG. 1F is a cross-sectional representation of a capacitor memory cell with a bottom electrode having a single-sided topography formed according to the method of the invention.
Figure 1G:
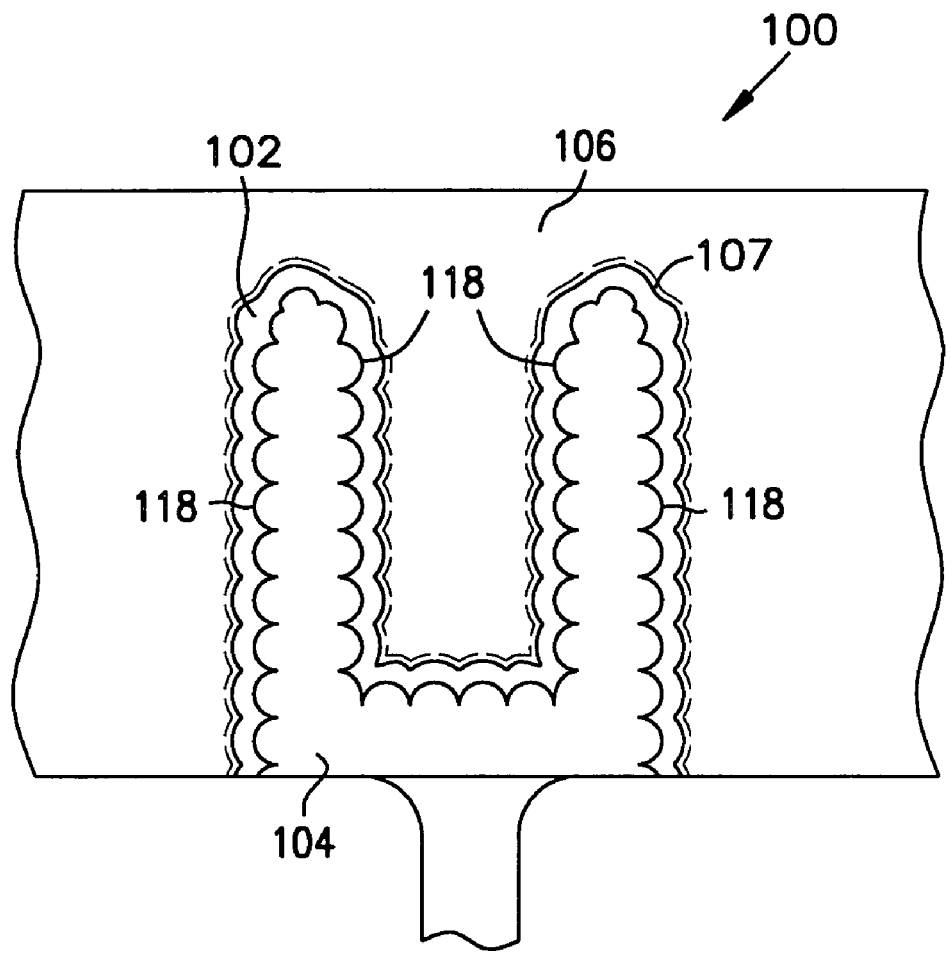
FIG. 1G is a cross-sectional representation of a trench-type capacitor memory cell with a bottom electrode having a roughened topography formed according to the method of the invention.

In one embodiment, polysilicon, crystalline silicon, hemispherical grain polysilicon, germanium, silicon-germanium, ruthenium, ruthenium oxide, iridium, iridium oxide, platinum, rhenium, and combinations thereof (deposited using chemical vapor deposition) is used as electrode 104, 106 material in a capacitor 100. An increased surface area polysilicon bottom plate electrode 104 is formed over a supporting semiconductor structure, as well known to one skilled in the art. The shape of the bottom plate electrode 104 may be stacked-type and trench-type structures, as illustrated in FIGS. 1A and 1B, to provide an increased capacitive surface area for the capacitor 100. The topography of the bottom plate electrode 104 may include single-sided as shown in FIG. 1F, double-sided as shown in FIG. 1A, and roughened as shown in FIG. 1G lower plate electrode 104 topographies produced using hemispherical grain (HSG) polysilicon. The lower plate 104 may be roughened on one side or both sides. The bottom plate electrode 104 can be doped or undoped, and rough or smooth. Phosphorus is a common dopant for a bottom plate electrode 104.

After cleaning the bottom plate electrode 104, such as with a hydrofluoric acid (HF) solution, the bottom plate electrode 104 is subjected to a surface treatment. The capacitor 100 is then annealed, such as by rapid thermal nitridation (RTN), rapid thermal oxidation (RTO), rapid thermal oxynitridation ($RTN_2O$), dry oxidation or high pressure oxidation.

A tantalum oxide film, such as tantalum penta oxide ($Ta_2O_5$), is then formed on the bottom plate electrode. The tantalum oxide film is preferably stoichiometric. Stoichiometric films have a lower defect density, resulting in a decreased leakage current. This is essential for optimum electrical properties, particularly in capacitors 100.

Tantalum oxide film deposition is accomplished in a manner known to those skilled in the art. In one embodiment, inorganic or organic precursors, both liquids and/or solids, may be used for starting materials. Then, tantalum is deposited on the bottom electrode 104 of the capacitor 100. Then the tantalum is oxidized to form the tantalum oxide film. Alternatively, the tantalum oxide film can also be formed by chemical vapor deposition (CVD) with tantalum and oxide sources. In one embodiment, using tantalum (V) ethoxide ($Ta(OC_2H_5)_5$) and oxygen ($O_2$) sources, a film of $Ta_2O_5$ can be deposited on the capacitor 100 with low pressure CVD (LPCVD) at a temperature between approximately 400 and 500 degrees Celsius.

The thickness of tantalum oxide film is approximately 30 to 200 angstroms, and typically 90 angstroms. The formation of tantalum oxide films is further described in P. C. Fazan et al., "A High-C Capacitor (20.4 fF/$\mu m^2$) with Ultrathin CVD-$Ta_2O_5$ Films Deposited on Rugged Poly-Si for High Density DRAMs," IEEE, pp. 263–266, 1992, and P. C. Fazan et al., "Ultrathin $Ta_2O_5$ Films on Rapid Thermal Nitrided Rugged Polysilicon for High Density DRAMs," International Conference on Solid State Devices and Materials, pp. 697–698, 1992, both incorporated herein by reference.

After formation of the tantalum oxide film, the capacitor 100 is annealed in an environment containing oxygen. This anneal crystallizes and fills vacancies 103, providing filled vacancies 105, in the tantalum oxide film, as exemplarily shown in FIG. 1A. This oxygen anneal may be performed after the subsequently described introduction of nitrogen, such as by anneal, if the nitrogen introduction is performed at a temperature of greater than approximately 600 degrees Celsius. In one embodiment, to form partially crystallized tantalum oxynitride, the oxygen anneal is performed after the nitrogen anneal, when the nitrogen introduction is performed at a temperature between approximately 500 and 750 degrees Celsius. In another embodiment, to form fully crystallized tantalum oxynitride, the oxygen anneal is performed after the nitrogen anneal when the nitrogen introduction is performed at a temperature between approximately 750 and 1050 degrees Celsius.

Subsequently, the tantalum oxide is transformed into tantalum oxynitride ($Ta_xN_yO_z$) film 102, where preferably $(y+z)/x>2.5$, by introducing nitrogen into the tantalum oxide film. In one embodiment, the transformation is accomplished annealing the tantalum oxide, in a furnace or with rapid thermal processing (RTP), in a nitrogen atmosphere at a temperature ranging between approximately 25 and 1100 degrees Celsius. The nitrogen atmosphere may be nitrogen ($N_2$), ammonia ($NH_3$), or hydrazene ($N_2H_4$).

In one embodiment, the capacitor 100 is annealed in nitrogen atmosphere at a temperature range between approximately 200 and 825 degrees Celsius, and at a pressure range between approximately 1 and 50 atmospheres. As a result, the tantalum oxynitride is formed to be amorphous. Amorphous tantalum oxynitride has a higher dielectric constant than crystalline tantalum oxynitride, and therefore can form capacitors having higher capacitance per area. Amorphous tantalum oxynitride can also be formed at temperatures between approximately 350 and 575 degrees Celsius, and pressures between approximately 10 milliTorr and 400 Torr. Preferably, the pressure is between approximately 1 atmosphere and 30 atmospheres.

In another embodiment, the capacitor 100 is annealed in an ammonia environment in a furnace at a temperature range between approximately 500 and 1050 degrees Celsius and at a pressure less than 5 torr for approximately 5 minutes. Alternatively, the capacitor 100 can be furnace annealed between approximately 1 and 60 minutes at a pressure between approximately 10 milliTorr and 1 atmosphere. In another embodiment, the capacitor 100 is annealed in a nitrogen environment, such as ammonia, with RTP between approximately 700 and 1050 degrees Celsius for a time between approximately 10 and 120 seconds. As a result of annealing, the tantalum oxide film is converted to a tantalum oxynitride film 102.

In yet a further embodiment, the capacitor 100 is annealed in a nitrogen atmosphere in the presence of a plasma. The plasma may be a plasma for enhanced deposition, such as high density plasma (HDP), a radio frequency (RF) plasma, or an electron cyclotron resonance (ECR) plasma, or a remote plasma. The nitrogen atmosphere may include the previously described nitrogen sources, $N_2O$, NO, $O_3$, $O_2$ or a combination thereof.

In yet another embodiment, the tantalum oxide film can be transformed into tantalum oxynitride film 102 by implanting nitrogen ions into the tantalum oxide. Ion implantation of nitrogen is known to persons skilled in the art.

In an alternative embodiment, the tantalum oxynitride film 102 can be directly formed by CVD, such as metal organo CVD (MOCVD), with tantalum and nitrogen sources, in a manner known to those skilled in the art. The tantalum source may be tantalum (V) ethoxide ($Ta(OC_2H_5)$). The nitrogen source may be $N_2$, $NH_3$, $N_2O$, $N_2H_4$, monomethyl hydrazine (MMH), or other nitrogen sources. The nitrogen source may be introduced to the capacitor 100 in the presence of one of the plasmas described above. Typically, the tantalum oxynitride film 102 formed by the methods described above has a crystalline structure.

However, it may be desirable to create tantalum oxynitride film 102 that is amorphous. To form an amorphous tantalum oxynitride film 102, a volatile nitrogen source such as hydrazene, or hydrazene derivatives such as monomethyl hydrazene (MMH), is used. As a result, the MOCVD process can be performed at relatively lower temperatures of between approximately 300 and 600 degrees Celsius to form the amorphous tantalum oxynitride film 102. Preferably, the temperature ranges between 400 and 550 degrees Celsius.

In another embodiment, to diminish the amount of carbon that subsequently enters the tantalum oxynitride film 102 to form a leakage mechanism, silicon containing material 107 is preferably formed on the tantalum oxynitride film 102. Thus, in one embodiment, a silicon nitridation process is used. The memory cell capacitor 100 is exposed to a combination of silicon and nitrogen sources. The silicon sources include silane, disilane and dichlorosilane. The nitrogen sources include $N_2$, $NH_3$, $N_2H_4$, $N_2O$, and MMH. In one embodiment, the silane and nitrogen are respectively disilane and ammonia combined in a one to five ratio. In another embodiment, this process is conducted for a sufficiently small period of time, such as less than the incubation time, so that no, or an insubstantial amount of, silicon nitride is actually formed on the capacitor 100.

After tantalum oxynitridation film 102 formation, the top electrode 106 is formed. In one embodiment, the top electrode 106 is formed from titanium nitride (TiN) either formed by CVD with an organic precursor such as tetradimethyl amino titanium (TDMAT), or by a high-temperature CVD process with inorganic precursors such as $TiCl_4$ and $NH_3$. Alternatively, the top electrode 106 may be initially formed with tungsten nitride. Subsequent processing of the capacitor 100 is completed in a manner known to those skilled in the art. For example, the capacitor 100 is later subjected to high temperature processing steps, such as BPSG reflow or polysilicon activation.

Figure 2:
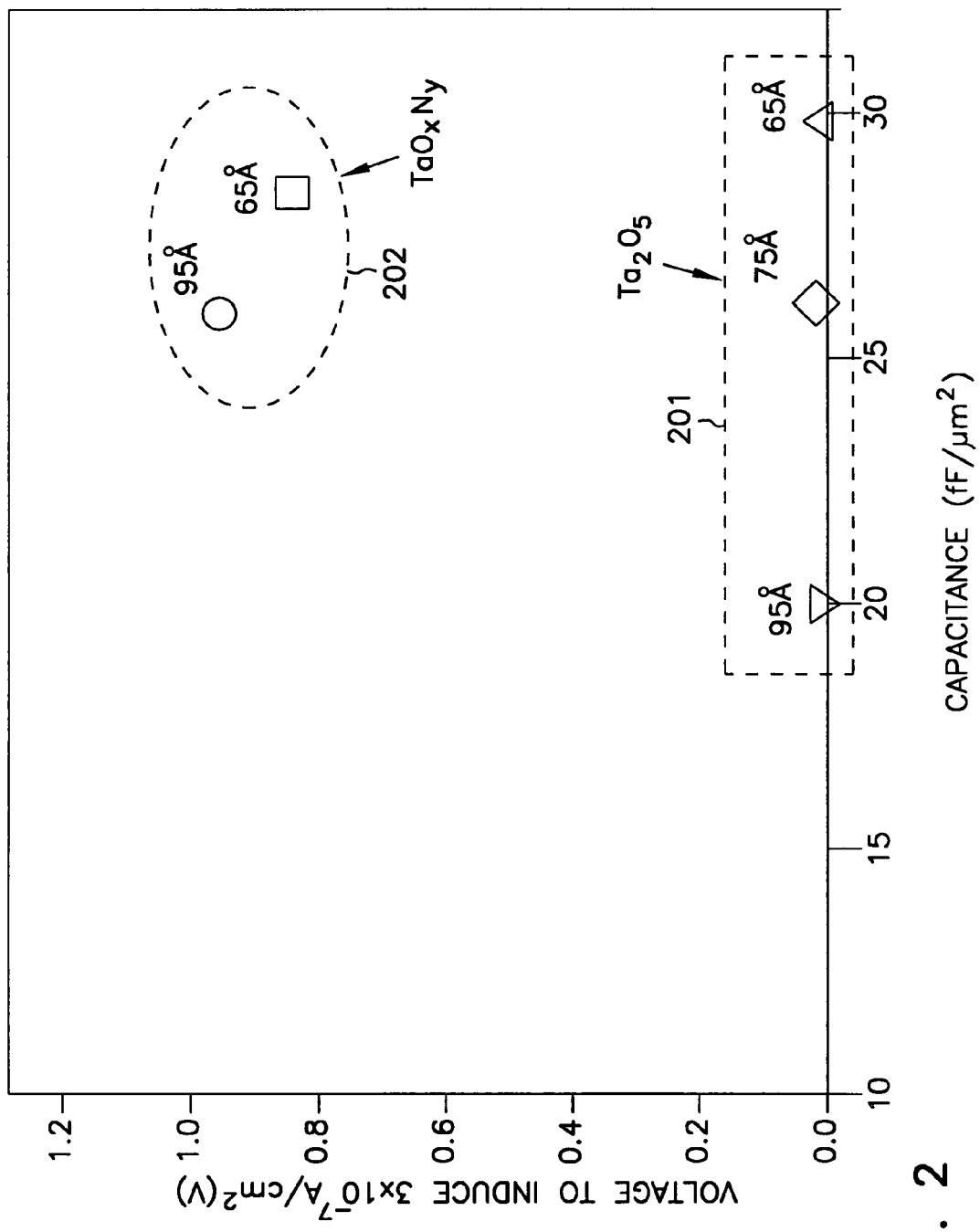
FIG. 2 is a graphical representation of voltage versus capacitance for planar tantalum penta oxide capacitive dielectric films formed according to the method of the invention compared to conventional silicon nitride capacitive dielectric films.

The resulting capacitor 100 has reduced leakage current when a dielectric that is tantalum oxynitride film 102 is used rather than tantalum oxide film. This beneficial property is illustrated in FIG. 2 which shows the voltage required to induce a leakage current density of $3 \times 10^{-7}$ $A/cm^2$ in a capacitor 100. FIG. 2 illustrates that such current density occurs in a capacitor 100 having a tantalum oxide film dielectric with the application of zero volts (201). However, at least 0.8 volts must be applied across a memory cell 100 with a tantalum oxynitride film 102 dielectric to induce the same current density (202). Thus, the tantalum oxynitride film 102 in a capacitor 100 reduces the leakage current density.

Figure 3A:
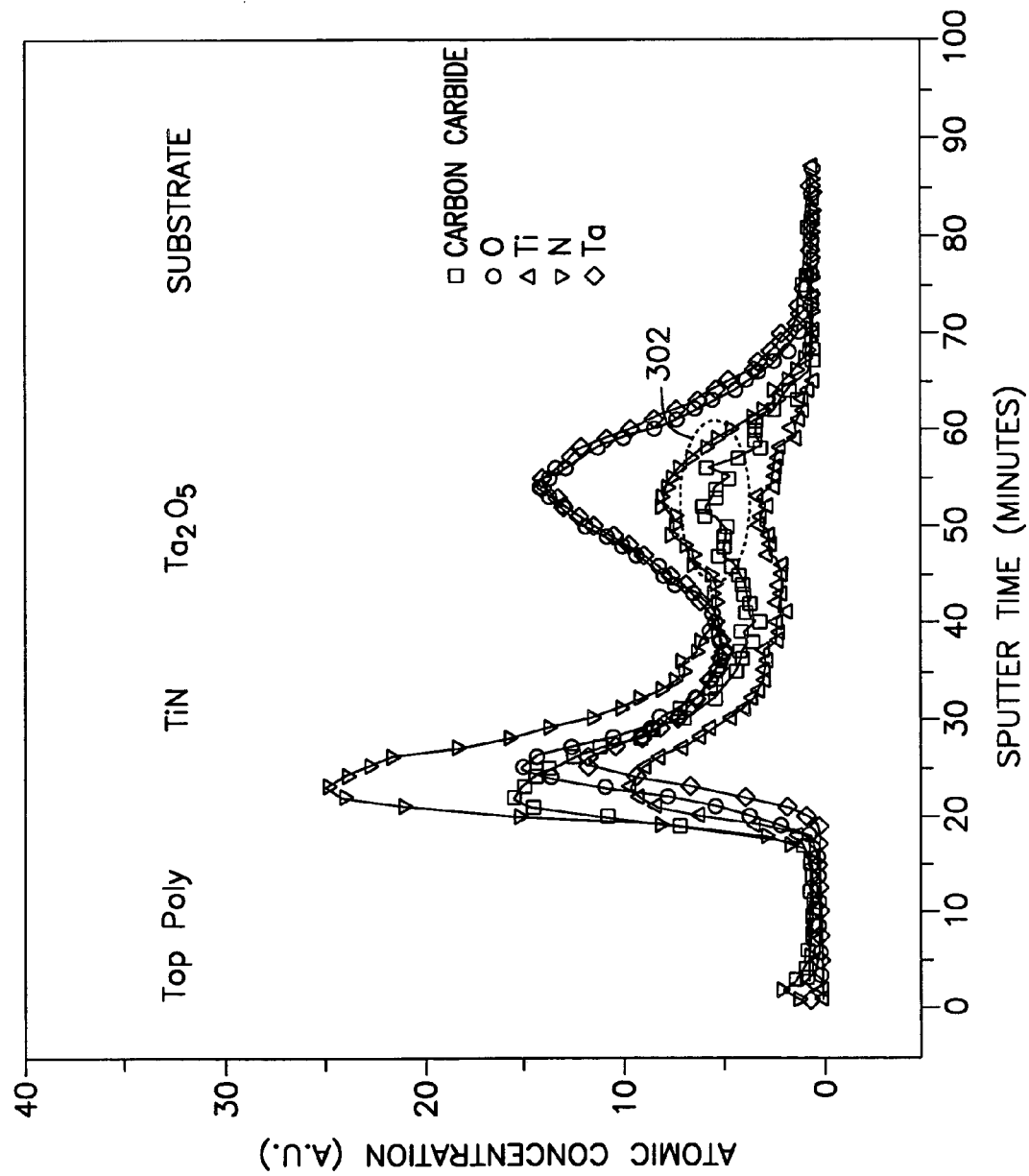
FIG. 3A is an Auger plot of atomic concentrations in a memory cell having a tantalum oxide dielectric.
Figure 3B:
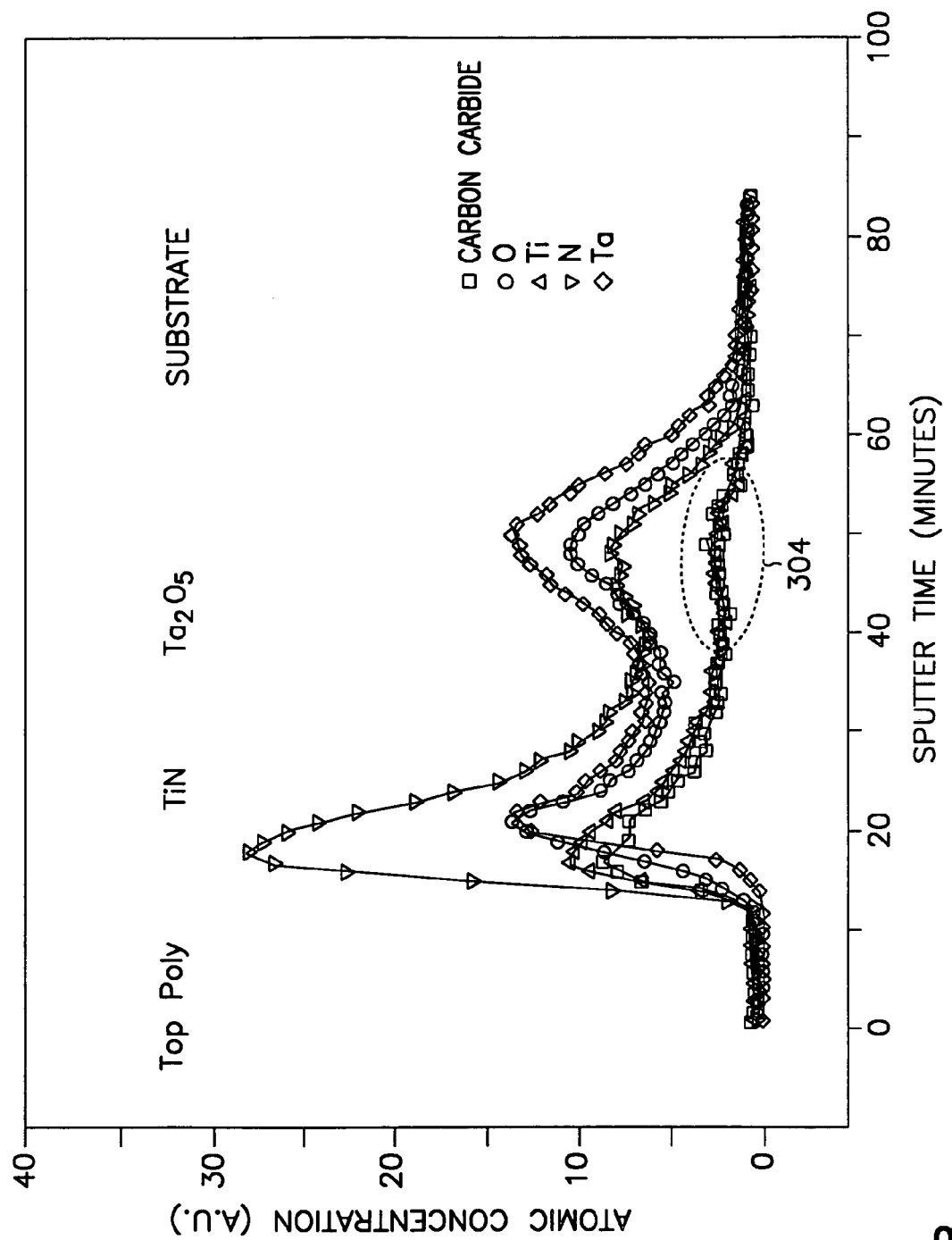
FIG. 3B is an Auger plot of atomic concentrations in a memory cell having a tantalum oxynitride dielectric

These benefits arise because the formation of the tantalum oxynitride film 102 and introduction of silicon, described above, diminish the amount of carbon that enters the tantalum oxynitride film 102 during the high temperature processing steps. FIGS. 3A and 3B are Auger plots of the relative concentrations of atomic concentrations of a capacitor 100 having dielectrics that are respectively tantalum oxide and tantalum oxynitride. FIGS. 3A and 3B show that the concentration of carbon carbide in the capacitor 100 having a tantalum oxynitride film 102 (304) is substantially less then for a capacitor 100 having a tantalum oxide film (302).

Additionally, the capacitors 100 made with the aforementioned process have significantly enhanced reliability resulting from the use of the tantalum oxynitride film 102. Specifically, the capacitor 100 has enhanced time-dependent dielectric breakdown and rupture voltage.

FIGS. 2 and 3 are illustrative of the present invention. However, different results may occur if process parameters, such as the length and temperature of the high temperature processing steps, vary.

The present invention can be performed in a single tool without exposing the capacitor 100 to the atmosphere. For example the nitridization of the bottom electrode 104, oxidation of the tantalum, and the nitridization of the tantalum oxide can be accomplished in a single tool. As a result, undesired effects, such as oxidation of the bottom electrode, can be diminished. Also, the stoichiometry of the tantalum oxynitride film 102 can be more tightly controlled.

Figure 4:
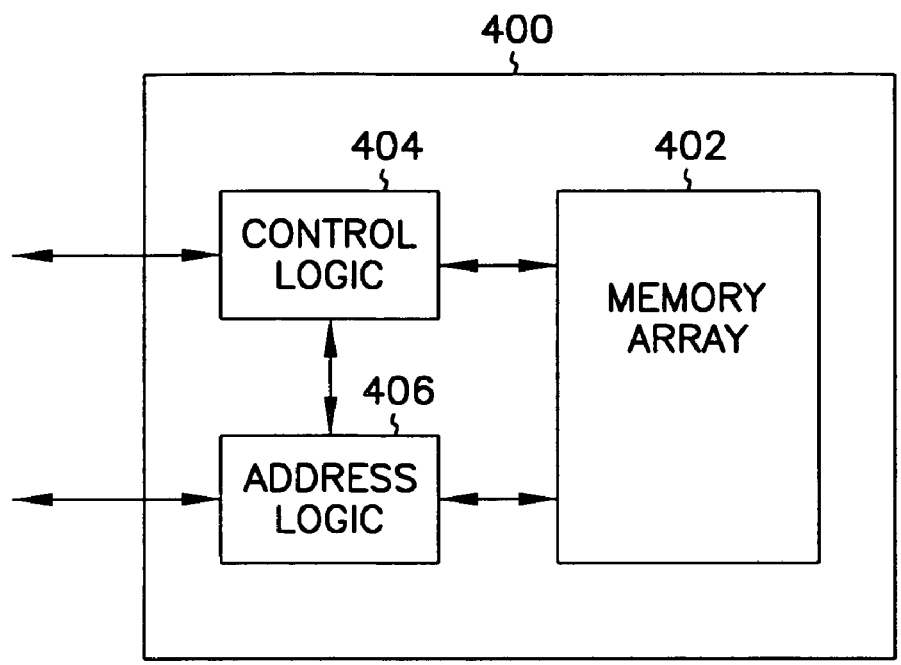
FIG. 4 is a block diagram of a memory having a capacitor in accordance with the present invention.
Figure 5:
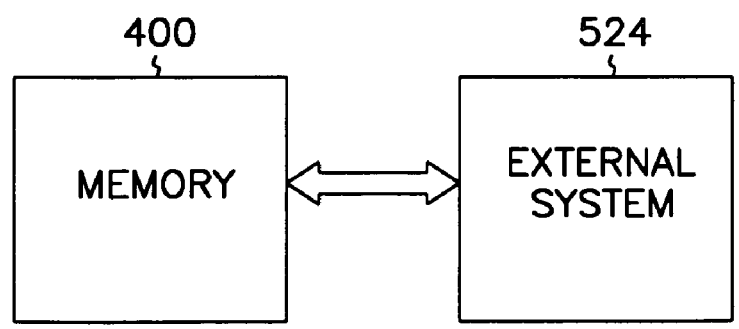
FIG. 5 is a block diagram of the memory of FIG. 4 coupled to an external system.

The aforementioned processes may be used to form capacitors 100 in a memory array 402 of a memory 400, such as a dynamic random access memory, as illustrated in FIG. 4. The memory 400 may include a memory array 402, control logic 404, and address logic 406 coupled in a manner known to one skilled in the art and exemplified in FIG. 4. The memory 400 may be coupled to an external system 524, such as a processor, as illustrated in FIG. 5.

The capacitor 100 made according to the present invention may also be used as an antifuse, for example, for programming redundant elements in a memory 400. The antifuse is activated in the following manner. A large voltage is applied across the electrodes 104, 106 of the capacitor 100. A hole is formed in the tantalum oxynitride film 102. As a result, the capacitor 100 becomes a resistor having a resistance between approximately 1000 and 6000 ohms, typically about 3000 ohms. The resistance may also range between approximately 500 and 7000 ohms. The antifuse is superior to other antifuse structures because it has a relatively lower resistance.

CONCLUSION

It is an advantage of the present invention that it forms a capacitor having relatively high capacitance to area ratio. It is also a benefit of the present invention that it is less affected by heat so as to have a diminished leakage current. It is also an advantage of the invention that the capacitor has enhanced reliability. It is a further benefit of the present invention that it can be performed in a single tool without exposing the memory cell 100 to the atmosphere. It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A capacitor, comprising:
   a bottom plate electrode;
   a tantalum oxynitride film on the bottom plate electrode;
   a silicon nitride film on the tantalum oxynitride film; and
   a top plate electrode on the silicon nitride film.

2. The capacitor of claim 1, wherein the silicon nitride film is a thin silicon nitride film.

3. The capacitor of claim 1, wherein the bottom plate electrode comprises a material selected from a group consisting of polysilicon, crystalline silicon, hemispherical grain polysilicon, germanium, silicon-germanium, ruthenium, ruthenium oxide, iridium, iridium oxide, platinum and rhenium.

4. The capacitor of claim 1, wherein the bottom plate electrode is doped.

5. The capacitor of claim 1, wherein the bottom plate electrode has a shape selected from a group consisting of fin-type, stacked-type, container-type, crown-type and trenched-type.

6. The capacitor of claim 1, wherein the bottom plate electrode has a topography selected from a group consisting of single-sided, double-sided, and roughened.

7. The capacitor of claim 1, wherein the tantalum oxynitride is amorphous.

8. The capacitor of claim 1, wherein the tantalum oxynitride is crystalline.

9. A capacitor, comprising:
a bottom plate electrode;
a tantalum oxynitride film on the bottom plate electrode;
a silicon nitride film on the tantalum oxynitride film; and
a top plate electrode on the silicon nitride film, the top plate electrode containing a material including one or more titanium nitride or tungsten nitride.

10. The capacitor of claim 9, wherein the silicon nitride film is a thin silicon nitride film.

11. The capacitor of claim 9, wherein the bottom plate electrode comprises a material selected from a group consisting of polysilicon, crystalline silicon, hemispherical grain polysilicon, germanium, silicon-germanium, ruthenium, ruthenium oxide, iridium, iridium oxide, platinum and rhenium.

12. The capacitor of claim 9, wherein the bottom plate electrode is doped.

13. The capacitor of claim 9, wherein the bottom plate electrode has a shape selected from a group consisting of fin-type, stacked-type, container-type, crown-type and trenched-type.

14. The capacitor of claim 9, wherein the bottom plate electrode has a topography selected from a group consisting of single-sided, double-sided, and roughened.

15. The capacitor of claim 9, wherein the tantalum oxynitride is amorphous.

16. The capacitor of claim 9, wherein the tantalum oxynitride is crystalline.

17. A capacitor, comprising: a bottom plate electrode;
a tantalum oxynitride film on the bottom plate electrode;
a silicon nitride film on the tantalum oxynitride film; and
a top plate electrode on the silicon nitride film, wherein the tantalum oxynitride film has vacancies configured by introducing nitrogen into a tantalum oxide film and, after introducing the nitrogen, annealing in an environment containing oxygen to fill a portion of pre-oxygen anneal vacancies in the tantalum oxynitride film.

18. The capacitor of claim 17, wherein the bottom plate electrode has a shape selected from a group consisting of fin-type, stacked-type, container-type, crown-type and trenched-type.

19. The capacitor of claim 17, wherein the tantalum oxynitride is amorphous.

20. A memory, comprising:
a memory array having a plurality of capacitors, each capacitor including:
a bottom plate electrode;
a tantalum oxynitride film on the bottom plate electrode;
a silicon nitride film on the tantalum oxynitride film; and
a top plate electrode on the silicon nitride film;
a control circuit, operatively coupled to the memory array; and
address logic, operatively coupled to the memory array and the control circuit.

21. The memory of claim 20, wherein the silicon nitride film is a thin silicon nitride film.

22. The memory of claim 20, wherein the bottom plate electrode comprises a material selected from a group consisting of polysilicon, crystalline silicon, hemispherical grain polysilicon, germanium, silicon-germanium, ruthenium, ruthenium oxide, iridium, iridium oxide, platinum and rhenium.

23. The memory of claim 20, wherein the bottom plate electrode is doped.

24. The memory of claim 20, wherein the bottom plate electrode has a shape selected from a group consisting of fin-type, stacked-type, container-type, crown-type and trenched-type.

25. The memory of claim 20, wherein the bottom plate electrode has a topography selected from a group consisting of single-sided, double-sided, single-sided roughened, and double-sided roughened.

26. The memory of claim 20, wherein the tantalum oxynitride is amorphous.

27. The memory of claim 20, wherein the tantalum oxynitride is crystalline.

28. A memory, comprising:
a memory array having a plurality of capacitors, each capacitor including:
a bottom plate electrode;
a tantalum oxynitride film on the bottom plate electrode;
a silicon nitride film on the tantalum oxynitride film; and
a top plate electrode on the silicon nitride film, the top plate electrode containing
a material including one or more of titanium nitride or tungsten nitride;
a control circuit, operatively coupled to the memory array; and
address logic, operatively coupled to the memory array and the control circuit.

29. The memory of claim 28, wherein the silicon nitride film is a thin silicon nitride film.

30. The memory of claim 28, wherein the bottom plate electrode comprises a material selected from a group consisting of polysilicon, crystalline silicon, hemispherical grain polysilicon, germanium, silicon-germanium, ruthenium, ruthenium oxide, iridium, iridium oxide, platinum and rhenium.

31. The memory of claim 28, wherein the bottom plate electrode is doped.

32. The memory of claim 28, wherein the bottom plate electrode has a shape selected from a group consisting of fin-type, stacked-type, container-type, crown-type and trenched-type.

33. The memory of claim 28, wherein the bottom plate electrode has a topography selected from a group consisting of single-sided, double-sided, single-sided roughened, and double-sided roughened.

34. The memory of claim 28, wherein the tantalum oxynitride is amorphous.

35. The memory of claim 28, wherein the tantalum oxynitride is crystalline.

36. A memory, comprising:
a memory array having a plurality of capacitors, each capacitor including:
a bottom plate electrode;
a tantalum oxynitride film on the bottom plate electrode;

a silicon nitride film on the tantalum oxynitride film; and a top plate electrode on the silicon nitride film, wherein the tantalum oxynitride film has vacancies configured by introducing nitrogen into a tantalum oxide film and, after introducing the nitrogen, annealing in an environment containing oxygen to fill a portion of pre-oxygen anneal vacancies in the tantalum oxynitride film; and a control circuit operatively coupled to the memory array.

37. The memory of claim 36, wherein the bottom plate electrode has a topography selected from a group consisting of single-sided, double-sided, and roughened.

38. The memory of claim 36, wherein the bottom plate electrode comprises a material selected from a group consisting of polysilicon, crystalline silicon, hemispherical grain polysilicon, germanium, silicon-germanium, ruthenium, ruthenium oxide, iridium, iridium oxide, platinum and rhenium.

39. A system, comprising:
a processor; and
a memory coupled to the processor, the memory including:
a memory array having a plurality of capacitors, each capacitor including:
a bottom plate electrode;
a tantalum oxynitride film on the bottom plate electrode;
a silicon nitride film on the tantalum oxynitride; and
a top plate electrode on the silicon nitride film;
a control circuit, operatively coupled to the memory array; and
address logic, operatively coupled to the memory array and the control circuit.

40. The system of claim 39, wherein the silicon nitride film is a thin silicon nitride film.

41. The system of claim 39, wherein the bottom plate electrode comprises a material selected from a group consisting of polysilicon, crystalline silicon, hemispherical grain polysilicon, germanium, and silicon-germanium.

42. The system of claim 39, wherein the bottom plate electrode is doped.

43. The system of claim 39, wherein the bottom plate electrode has a shape selected from a group consisting of fin-type, stacked-type and trenched-type.

44. The system of claim 39, wherein the bottom plate electrode has a topography selected from a group consisting of single-sided, double-sided, and roughened.

45. The system of claim 39, wherein the tantalum oxynitride is amorphous.

46. The system of claim 39, wherein the tantalum oxynitride is crystalline.

47. The system of claim 39, wherein the tantalum oxynitride film has vacancies configured by introducing nitrogen into a tantalum oxide film and, after introducing the nitrogen, annealing in an environment containing oxygen to fill a portion of pre-oxygen anneal vacancies in the tantalum oxynitride film; and.

48. A system, comprising:
a processor;
a memory coupled to the processor, the memory including:
a memory array having a plurality of capacitors, each capacitor including:
a bottom plate electrode;
a tantalum oxynitride film on the bottom plate electrode;
a silicon nitride film on the tantalum oxynitride film; and
a top plate electrode on the silicon nitride film, the top plate electrode
containing a material including one or more of titanium nitride or tungsten nitride;
a control circuit, operatively coupled to the memory array; and
address logic, operatively coupled to the memory array and the control circuit.

49. The system of claim 48, wherein the silicon nitride film is a thin silicon nitride film.

50. The system of claim 48, wherein the bottom plate electrode comprises a material selected from a group consisting of polysilicon, crystalline silicon, hemispherical grain polysilicon, germanium, and silicon-germanium.

51. The system of claim 48, wherein the bottom plate electrode is doped.

52. The system of claim 48, wherein the bottom plate electrode has a shape selected from a group consisting of fin-type, stacked-type and trenched-type.

53. The system of claim 48, wherein the bottom plate electrode has a topography selected from a group consisting of single-sided, double-sided, and roughened.

54. The system of claim 48, wherein the tantalum oxynitride is amorphous.

55. The system of claim 48, wherein the tantalum oxynitride is crystalline.

* * * * *

UNITED STATES PATENT AND TRADEMARK OFFICE
CERTIFICATE OF CORRECTION

PATENT NO.       : 7,038,265 B2                                    Page 1 of 1
APPLICATION NO.  : 11/073800
DATED            : May 2, 2006
INVENTOR(S)      : DeBoer et al.

It is certified that error appears in the above-identified patent and that said Letters Patent is hereby corrected as shown below:

On the Title page, Item (56) References Cited, above "OTHER PUBLICATIONS", insert

--         FOREIGN PATENT DOCUMENTS

JP     JP-09-055478     2/1997 --.

In column 12, line 8, after "oxynitride film" delete "; and".

Signed and Sealed this

First Day of August, 2006

JON W. DUDAS
*Director of the United States Patent and Trademark Office*